(12) United States Patent
Wehlus

(10) Patent No.: US 9,923,173 B2
(45) Date of Patent: Mar. 20, 2018

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventor: Thomas Wehlus, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/592,224

(22) Filed: May 11, 2017

(65) Prior Publication Data

US 2017/0331074 A1 Nov. 16, 2017

(30) Foreign Application Priority Data

May 11, 2016 (DE) .......................... 10 2016 108 681

(51) Int. Cl.
*H01L 51/52* (2006.01)
*H01L 51/00* (2006.01)
*H01L 51/56* (2006.01)

(52) U.S. Cl.
CPC ...... *H01L 51/5268* (2013.01); *H01L 51/0096* (2013.01); *H01L 51/5206* (2013.01);
(Continued)

(58) Field of Classification Search
CPC . H01L 51/5268; H01L 51/5262; H01L 51/56; H01L 51/0096; H01L 51/5206;
(Continued)

(56) References Cited

U.S. PATENT DOCUMENTS 7,560,747 B2 * 7/2009 Cok .................... H01L 51/5253
257/98
2013/0161684 A1 * 6/2013 Momma ................. H01L 33/52
257/100
(Continued)

FOREIGN PATENT DOCUMENTS

CH          709370 A1    9/2015
DE     102011005612 A1   9/2012
(Continued)

OTHER PUBLICATIONS

German Search Report based on application No. 10 2016 108 681.9 (8 pages) dated Mar. 3, 2017 (Reference Purpose Only).

*Primary Examiner* — Michael Trinh
(74) *Attorney, Agent, or Firm* — Viering, Jentschura & Partner mbB

(57) ABSTRACT

In various embodiments, an optoelectronic component is provided. The optoelectronic component includes a metal substrate having a surface, an electrically conductive planarization layer on the surface of the metal substrate, wherein the planarization layer comprises a surface, an organically functional layer structure on or above the surface of the planarization layer, and an electrode layer formed in a transparent fashion on or above the organically functional layer structure. The roughness of the surface of the planarization layer is lower than the roughness of the surface of the metal substrate. The surface of at least one of the metal substrate or the planarization layer is formed in a light-scattering fashion.

13 Claims, 2 Drawing Sheets

(52) U.S. Cl.
CPC ...... *H01L 51/5234* (2013.01); *H01L 51/5237* (2013.01); *H01L 51/5253* (2013.01); *H01L 51/5262* (2013.01); *H01L 51/56* (2013.01)

(58) Field of Classification Search
CPC ............. H01L 51/5234; H01L 51/5209; H01L 51/5225; H01L 51/5237; H01L 51/5253
See application file for complete search history.

(56) References Cited

U.S. PATENT DOCUMENTS

| | | |
|---|---|---|
| 2014/0374729 A1 | 12/2014 | Dobbertin et al. |
| 2015/0325803 A1* | 11/2015 | Lee ..................... H01L 51/442 257/40 |
| 2016/0197314 A1* | 7/2016 | Yoon .................. H01L 51/5206 438/27 |
| 2016/0365541 A1 | 12/2016 | Wehlus |

FOREIGN PATENT DOCUMENTS

| | | |
|---|---|---|
| DE | 102012201457 A1 | 8/2013 |
| DE | 102014102256 A1 | 8/2015 |

\* cited by examiner

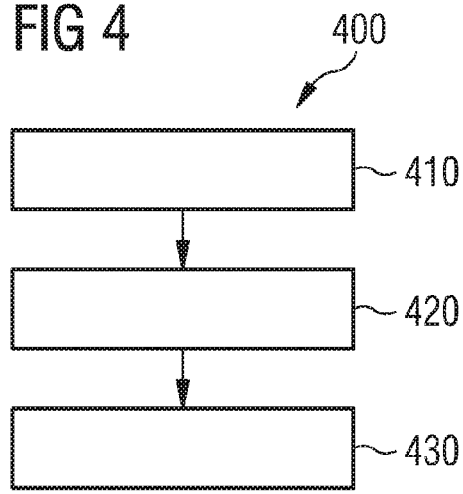
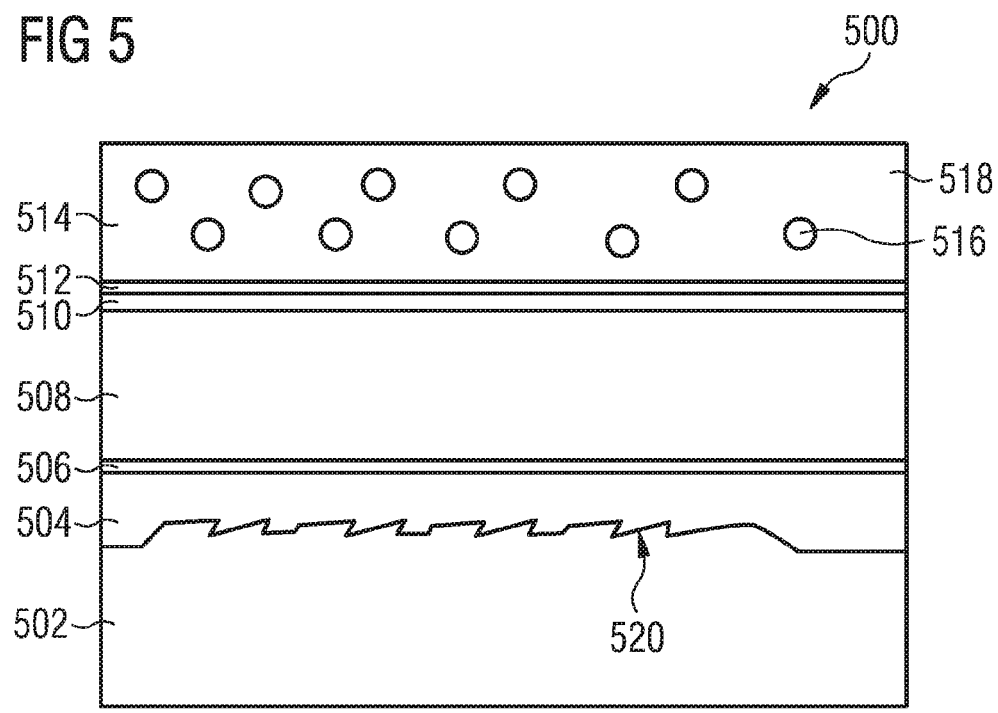

OPTOELECTRONIC COMPONENT AND METHOD FOR PRODUCING AN OPTOELECTRONIC COMPONENT

CROSS-REFERENCE TO RELATED APPLICATION

This application claims priority to German Patent Application Serial No. 10 2016 108 681.9, which was filed May 11, 2016, and is incorporated herein by reference in its entirety.

TECHNICAL FIELD

Various embodiments relate generally to a light-emitting component and to a method for producing a light-emitting component.

BACKGROUND

A conventional light-emitting component (see FIG. 5), for example an OLED 500, may include an anode 506 and a cathode 510 with an organically functional layer system 508 therebetween. The organically functional layer system 508 may include one or a plurality of emitter layer(s) in which electromagnetic radiation is generated, one or a plurality of charge generating layer structures each including two or more charge generating layers (CGL) for charge generation, and one or a plurality of electron blocking layers, also referred to as hole transport layer(s) (HTL), and one or a plurality of hole blocking layers, also referred to as electron transport layer(s) (ETL), in order to direct the current flow.

In some fields of application, a steel foil 502 is used as substrate for the OLED 500. Firstly, a planarization 504 is applied on the steel foil 502 by means of screen printing or inkjet printing. The planarization is conventionally necessary since the surface 520 of the steel foil is relatively rough, as a result of which the stability of the organic material, e.g. of the organically functional layer system 508, is impaired. Afterward, a silver layer is applied to the planarization 504 by vapor deposition or printing. The silver layer acts as a specularly reflective anode 506 (anode mirror) for the OLED 500. In these fields of application, the cathode 510 is formed in a semitransparent fashion, such that light is coupled out from the OLED 500 through the cathode 510 during operation. Afterward, the OLED is encapsulated by means of a thin-film encapsulation 512 and provided with a scattering layer 514 in order to increase the proportion of coupled-out light and hence the efficiency of the OLED 500. In the scattering layer 514, scattering particles 516 are arranged in a matrix 518.

The scattering particles 516 can potentially bring about damage to the OLED 500. Moreover, a structured deposition of scattering particles 516 on the thin-film encapsulation 512 is difficult. The production of an OLED 500 of this type is thus very complex.

SUMMARY

In various embodiments, an optoelectronic component is provided. The optoelectronic component includes a metal substrate having a surface, an electrically conductive planarization layer on the surface of the metal substrate, wherein the planarization layer comprises a surface, an organically functional layer structure on or above the surface of the planarization layer, and an electrode layer formed in a transparent fashion on or above the organically functional layer structure. The roughness of the surface of the planarization layer is lower than the roughness of the surface of the metal substrate. The surface of at least one of the metal substrate or the planarization layer is formed in a light-scattering fashion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a flow diagram of a method for producing an optoelectronic component in accordance with various embodiments; and FIG. 5 shows a schematic sectional illustration of a conventional optoelectronic component.

DESCRIPTION

Figure 1:
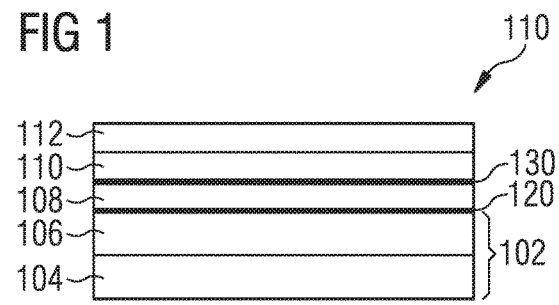
FIG. 1 shows a schematic sectional illustration of one embodiment of an optoelectronic component.

In the following detailed description, reference is made to the accompanying drawings, which form part of this description and show for illustration purposes specific embodiments in which the invention can be implemented. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, insofar as this is expedient.

Various embodiments provide a highly efficient, scattering and optoelectronic component and a method for producing the latter, wherein the substrate of the optoelectronic component is a metal substrate.

In various aspects, an optoelectronic component is provided which includes a metal substrate having a surface. An electrically conductive planarization layer is formed on the surface of the metal substrate, wherein the planarization layer includes a surface. The roughness of the surface of the planarization layer is lower than the roughness of the surface of the metal substrate. An organically functional layer structure is formed on or above the surface of the planarization layer. An electrode layer formed in a transparent fashion is formed on or above the organically functional layer structure. The surface of the metal substrate and/or the planarization layer are/is formed in a light-scattering fashion.

The planarization layer is formed directly on the surface of the metal substrate.

This enables scattering particles on the encapsulation of organic light-emitting diodes to become optional, with approximately the same efficiency or with the same efficiency. Furthermore, an effect that can be achieved is that the structured formation of scattering centers is facilitated, for example by the structuring process being decoupled from the further processes for the production of the optoelectronic component. Moreover, the deposition of at least one layer can be obviated since, by way of example, the properties of different layers are combined in the planarization layer and/or the metal substrate.

In one development, the metal substrate includes a second electrode layer and a metal carrier. The second electrode layer is arranged on the metal carrier. The surface of the second electrode layer forms the surface of the metal substrate. This makes it possible to set the electrical, thermal and mechanical properties at the surface of the metal substance substantially independently of the properties of the metal carrier.

In one development, the metal carrier is a steel plate or a steel foil, for example an SUS steel. This makes it possible to use particularly cost-effective substrates.

In one development, the planarization layer has a thickness that is greater than 2 times the roughness, for example Rz or Rq, of the surface of the metal substrate. This enables a reliable planarization of the surface of the metal substrate.

In another development, the planarization layer includes scattering centers embedded in a matrix. This enables a light scattering in the planarization layer and thus, in a simple manner, a setting of the light scattering in relation to a predefined light scattering.

In one development, the scattering centers are formed in an electrically conductive fashion. This enables an improved electrical connection between organically functional layer structure and metal substrate.

In another development, the optoelectronic component is a light-emitting component.

In a further aspect, a method for producing an optoelectronic component is provided. The method includes forming an electrically conductive planarization layer on the surface of a metal substrate. The planarization layer includes a surface. The roughness of the surface of the planarization layer is lower than the roughness of the surface of the metal substrate. The surface of the metal substrate and/or the planarization layer are/is formed in a light-scattering fashion. The method furthermore includes forming an organically functional layer structure on or above the surface of the planarization layer. The method additionally includes forming a transparent electrode layer on or above the organically functional layer structure.

In one development, the planarization layer is formed with scattering centers embedded in a matrix. This enables a light scattering in the planarization layer and thus, in a simple manner, a setting of the light scattering in relation to a predefined light scattering.

In one development, the planarization layer is formed by means of a paste, wherein the paste includes the material of the matrix and the scattering centers. This enables a simple and cost-effective production of the planarization layer.

In one development, the planarization layer is formed by arranging a material in a particulate fashion on or above the metal substrate, wherein the particles include the material of the matrix. This enables a simple and cost-effective production of the planarization layer.

In one development, the particles furthermore include the scattering centers. This enables a simple and cost-effective production of the planarization layer.

In a further development, the planarization layer is furthermore formed with cavities arranged between the particles of the material of the matrix and the scattering centers. This enables an additional light scattering. Furthermore, the cavities can have the effect that thermal and mechanical stresses of the planarization layer are reduced.

In one development, the metal substrate includes a second electrode layer and a metal carrier. The second electrode layer is arranged on the metal carrier. The surface of the second electrode layer is the surface of the metal substrate. This makes it possible to set the electrical, thermal and mechanical properties at the surface of the metal substrate substantially independently of the properties of the metal carrier.

In a further development, the optoelectronic component is formed as a light-emitting component.

In various developments, the method for producing the optoelectronic component includes the same features as the optoelectronic component, and vice versa.

An optoelectronic assembly may include one, two or more optoelectronic components. Optionally, an optoelectronic assembly can also include one, two or more electronic components. An electronic component may include for example an active and/or a passive component. An active electronic component may include for example a computing, control and/or regulating unit and/or a transistor. A passive electronic component may include for example a capacitor, a resistor, a diode or a coil.

An optoelectronic component can be an electromagnetic radiation emitting component or an electromagnetic radiation absorbing component. An electromagnetic radiation absorbing component can be a solar cell, for example. In various embodiments, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be formed for example as a light-emitting diode (LED), as an organic light-emitting diode (OLED), as a light-emitting transistor or as an organic light-emitting transistor. In various embodiments, the light-emitting component can be part of an integrated circuit. Furthermore, a plurality of light-emitting components can be provided, for example in a manner accommodated in a common housing.

In accordance with various configurations, the light-emitting component (e.g. organic light-emitting component such as e.g. OLED) can be embodied as a "top emitter".

The term "top emitter" or "top emitting light-emitting component" as used herein, denotes for example an embodiment which is embodied as transparent toward the side facing away from the substrate (to put it another way, toward the top side) of the light-emitting component. In various embodiments, for this purpose, the layers (e.g. electrode (top electrode) formed between functional layer(s) and barrier thin-film layer, barrier thin-film layer, intermediate layer, cover layer) formed on or above the at least one functional layer of the light-emitting component can be embodied as transparent. Accordingly, a light-emitting component embodied as a top emitter can emit for example radiation generated in the functional layers (e.g. organically functional layers in the case of an organic light-emitting component such as e.g. an OLED) on the top side of the light-emitting component.

A light-emitting component configured as a top emitter in accordance with various embodiments may have a high coupling-out of light and a very small angle dependence of the radiance. In accordance with various embodiments, a light-emitting component may be used for lighting systems, such as room luminars, for example.

The term "translucent" or "translucent layer" can be understood to mean that the layer is transmissive to light, for example to the light generated by the optoelectronic component. By way of example, the term "translucent layer" should be understood to mean that substantially the entire quantity of light coupled into the layer is also coupled out from the layer, wherein part of the light is scattered in the process. The term "transparent" or "transparent layer" can be understood to mean that the layer is transmissive to light, wherein light coupled into the layer is also coupled out from the layer substantially without scattering or light conversion.

FIG. 1 shows a schematic sectional illustration of one embodiment of an optoelectronic component 100 in accordance with various embodiments.

The optoelectronic component 100 includes a metal substrate 102 having a surface 120.

An electrically conductive planarization layer 108 is formed on the surface 120 of the metal substrate 102. The planarization layer 108 includes a surface 130. The roughness of the surface 130 of the planarization layer 108 is lower than the roughness of the surface 120 of the metal substrate 102. The surface of the metal substrate and/or the planarization layer are/is formed in a light-scattering fashion. The planarization layer 108 is formed directly on the surface 120 of the metal substrate 102.

By way of example, the metal carrier 104 is a steel plate or a steel foil, for example composed of an SUS steel. Silver is applied directly to the metal carrier 104 by vapor deposition, as a result of which the first electrode layer 106 is formed. A conductive transparent (scattering) layer is printed onto the silver, as a result of which the planarization layer 108 is formed. Said planarization layer 108 includes or is formed from AZO or ITO particles, for example. These particles have the task of scattering light which traverses the planarization layer 108, of producing an electrically conductive connection to the metal carrier 104 and of providing a smooth surface for the further layer growth. The layer should have a high refractive index, for example greater than 1.7. The light scattering in the planarization layer 108 can be based on two possibilities, for example: the light scattering can take place at the rough surface of the metal carrier 104 and the AZO/ITO particles of the planarization layer 104 serve for planarization. Alternatively, the light scattering takes place in the planarization layer by virtue of particles of $TiO_2$ or $SiO_2$, for example, being added to the AZO/ITO particles in order to bring about a scattering.

Afterward, the further layers of the optoelectronic component are formed, for example by vapor deposition, on the smooth surface 130.

In one development, the planarization layer 108 has a thickness that is greater than 2 times the roughness, for example Rz or Rq, of the surface 120 of the metal substrate 102. In one development, the metal substrate 102 includes a first electrode layer 106 and a metal carrier 104. The first electrode layer 106 is arranged on the metal carrier 104. The surface of the first electrode layer 106 forms the surface 120 of the metal substrate 102. In one development, the metal carrier 104 is a steel plate or a steel foil. In another development, the planarization layer 108 furthermore includes cavities. In another development, the scattering centers 304 are formed in an electrically conductive fashion.

An organically functional layer structure 110 is formed on or above the surface 130 of the planarization layer 108.

An electrode layer 112 formed in a transparent fashion is formed on or above the organically functional layer structure 110.

In another development, the optoelectronic component 100 is a light-emitting component 100.

Figure 2:
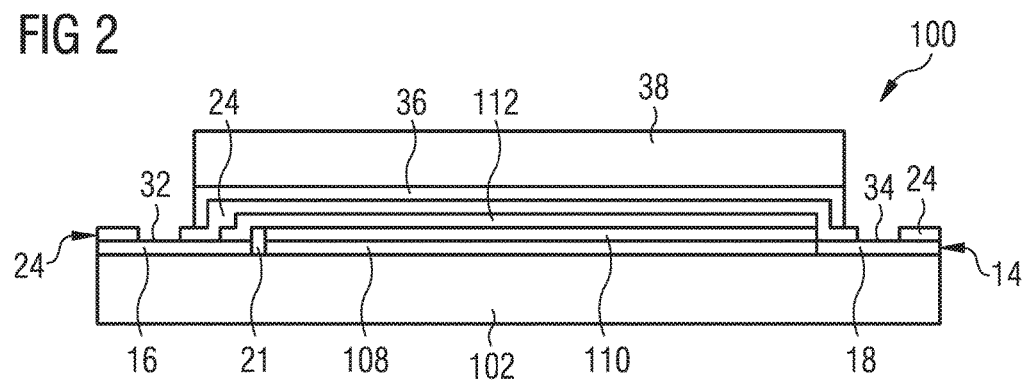
FIG. 2 shows a schematic sectional illustration of one embodiment of an optoelectronic component.

FIG. 2 shows a schematic sectional view of an optoelectronic component 100 which can for example largely correspond to the embodiment shown in FIG. 1.

The optoelectronic component 100 includes the substrate 102 described above.

The active region is formed on the substrate 102. The active region includes a first electrode layer, which includes a first contact section 16, a second contact section 18 and the first electrode layer 106 and the planarization layer 108.

The first electrode layer 106 and the planarization layer 108 are electrically insulated from the first contact section 16 by means of an electrical insulation barrier 21. The second contact section 18 is electrically coupled to the first electrode layer 106 and the planarization layer 108.

The first electrode layer 106 can be formed as an anode or as a cathode. The first electrode layer 106 can be formed as translucent or transparent. The first electrode layer 106 includes an electrically conductive material, for example metal and/or a transparent conductive oxide (TCO) or a layer stack of a plurality of layers including metals or TCOs. The first electrode layer 106 may include for example a layer stack of a combination of a layer of a metal on a layer of a TCO, or vice versa. One example is a silver layer applied on an indium tin oxide (ITO) layer (Ag on ITO) or ITO-Ag-ITO multilayers. The first electrode layer 106 may include as an alternative in addition to the materials mentioned: networks composed of metallic nanowires and nanoparticles, for example composed of Ag, networks composed of carbon nanotubes, graphene particles and graphene layers and/or networks composed of semiconducting nanowires.

The planarization medium 108 is formed on the first electrode layer 106, the organically functional layer structure 110 being formed above said planarization medium and being configured for example for emitting light. The organically functional layer structure 110 may include for example one, two or more sublayers. By way of example, the organically functional layer structure 110 may include a hole injection layer, a hole transport layer, an emitter layer, an electron transport layer and/or an electron injection layer. The hole injection layer serves for reducing the band gap between first electrode layer 106 and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organically functional layer structure 110 may include one, two or more functional layer structure units each including the abovementioned sublayers and/or further intermediate layers.

The second electrode layer 112 is formed above the organically functional layer structure 110, which second electrode layer can also be referred to as second electrode 110. The second electrode 110 is electrically coupled to the first contact section 16. The second electrode 110 can be formed in accordance with one of the configurations of the first electrode layer 106, wherein the first electrode layer 106 and the second electrode 110 can be formed identically or differently. The first electrode layer 106 serves for example as an anode or a cathode of the active region. The second electrode 110, in a corresponding manner to the first electrode, serves as a cathode or an anode of the active region.

A getter structure (not illustrated), which is part of the encapsulation structure 112, can be arranged on or above the active region 130. The getter layer can be formed as translucent, transparent or opaque. The getter layer may include or be formed from a material which absorbs and binds substances that are harmful to the active region.

An encapsulation layer 24 of the active region is formed above the second electrode 110 and partly above the first contact section 16 and partly above the second contact section 18, said encapsulation layer encapsulating the active region. The encapsulation layer 24 is part of the encapsulation structure 118 and can be formed as a second barrier layer, for example as a second barrier thin-film layer. The encapsulation layer 24 can also be referred to as thin-film encapsulation. The encapsulation layer 24 forms a barrier with respect to chemical contaminants and/or atmospheric substances, e.g. with respect to water (moisture) and oxygen. The encapsulation layer 24 can be formed as a single layer, a layer stack or a layer structure. The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof. If appropriate, the first barrier layer can be formed on the substrate 102 in a corresponding manner to a configuration of the encapsulation layer 24.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion medium layer 36, which is part of the encapsulation structure 118, is formed above the encapsulation layer 24. The adhesion medium layer 36 includes for example an adhesion medium, for example an adhesive, for example a lamination adhesive, a lacquer and/or a resin. The adhesion medium layer 36 may include for example particles which scatter electromagnetic radiation, for example light-scattering particles.

A covering body 38, which is likewise part of the encapsulation structure 118, is formed above the adhesion medium layer 36. The adhesion medium layer 36 serves for fixing the covering body 38 to the encapsulation layer 24. The covering body 38 includes for example plastic, glass and/or metal. By way of example, the covering body 38 can be formed substantially from glass and include a thin metal layer, for example a metal foil, and/or a graphite layer, for example a graphite laminate, on the glass body. The covering body 38 serves for protecting the conventional light-emitting component 1, for example against mechanical force influences from outside. Furthermore, the covering body 38 can serve for distributing and/or dissipating heat generated in the conventional light-emitting component 1. By way of example, the glass of the covering body 38 can serve as protection against external influences and the metal layer of the covering body 38 can serve for distributing and/or dissipating the heat that arises during the operation of the conventional light-emitting component 1.

Figure 3:
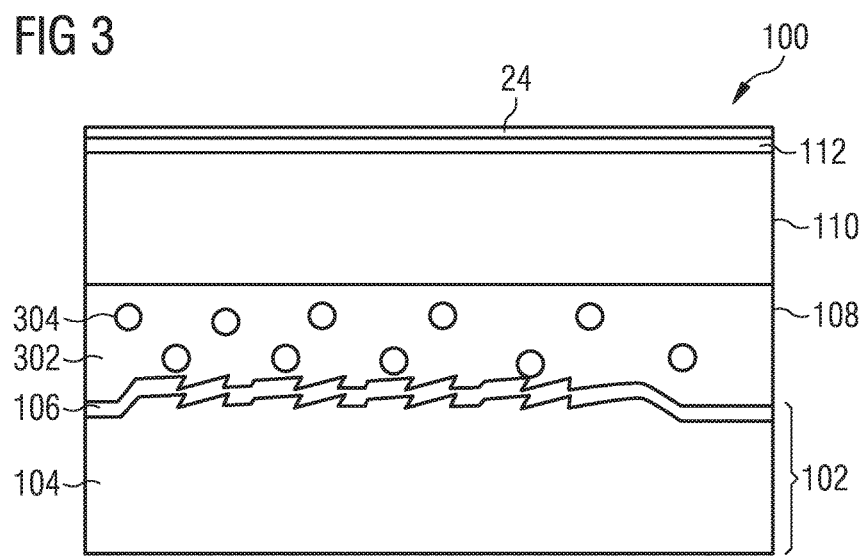
FIG. 3 shows a schematic sectional illustration of one embodiment of an optoelectronic component.

FIG. 3 shows a schematic sectional view of an optoelectronic component 100 which can for example largely correspond to an embodiment shown above.

In various developments, the planarization layer includes scattering centers embedded in a matrix. FIG. 3 shows the scattering centers 304, embedded in the matrix 302, of the electrically conductive or electrically conductively formed planarization layer 108 in accordance with various embodiments.

The scattering centers 304 can be formed as light-scattering particles 304. The scattering centers 304 can be dielectric scattering centers, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that differs from the effective refractive index of the matrix 302 of the planarization layer 108, for example air bubbles, acrylate, or hollow glass beads. Furthermore, by way of example, metallic nanoparticles, metals such as gold, silver, iron nanoparticles, or the like can be provided as scattering centers 304.

The scattering centers 304 have a second refractive index, which is lower than the first refractive index. In this context, the scattering centers 304 can also be referred to as low refractive index scattering centers 304. The second refractive index can be for example in a range of 1 to 1.7. The scattering centers 304 may include or be formed by microstructures or nanostructures, for example. Microstructures are for example bodies having at least one exterior dimension that lies in a range of from greater than or equal to 1 μm to less than 1 mm. The microstructures include for example microparticles, microcavities and/or micropores. Nanostructures are for example bodies having at least one exterior dimension that is in a range of from greater than or equal to 1 nm to less than 1 μm. The nanostructures include for example nanoparticles, nanotubes, nanowires, nanopores and/or nanodots.

If the scattering centers 304 are formed by cavities and/or pores in the carrier material 302, then the cavities and/or pores can be filled with air or gas or each contain a vacuum. The scattering centers 304 can be formed such that they have no or only low absorption with regard to the generated light to be scattered. The scattering centers 304 can for example include or be formed by $SiO_2$ and/or have a second refractive index of 1.5. The scattering centers 304 can be formed in an electrically conductive or electrically insulating fashion.

The matrix 302, also referred to as carrier material 302, is electrically conductive and can also be referred to as an intrinsically conductive matrix. The carrier material 302 may include or be formed by, for example, a transparent conductive material, for example a TCO (Transparent Conductive Oxide), for example ITO. The carrier material 302 has a first refractive index. The first refractive index can be for example at least 1.7, for example be in a range of 1.7 to 2.7, for example between 1.7 and 2.1, for example can be 1.7 in the case of ITO.

The carrier material 302 can optionally be formed in an electrically insulating fashion. The carrier material 302 may include a transparent or translucent material, for example. The carrier material 302 may include or be formed by a polymer, for example. The polymer can have for example a high index polymer having a refractive index of at least 1.7, for example between 1.7 and 2.7, for example between 1.7 and 2.1.

The scattering centers 304 can be formed for example in accordance with the scattering centers 304 explained above. The scattering centers 304 can be formed in an electrically conductive or electrically insulating fashion. In the case of a carrier material 302 formed in an electrically insulating fashion, the scattering centers 304 can be formed in an electrically conductive fashion. Alternatively, the planarization layer 108 can additionally include conduction elements that are embedded in the matrix 302. The conduction elements can also be referred to as electrically conductive additives. The conduction elements at least partly perform the current carrying. The conduction elements can be embedded in the carrier material 302 for example such that the electrical conductivity of the electrode layer 104 is provided on account of percolation of the conduction elements. In other words, the proportion by volume of the conduction elements can be above the percolation threshold. The conduction elements may include or be formed by microstructures or nanostructures, for example, by means of which the electrical conductivity can be ensured. The conduction elements include for example metal, for example silver, gold and/or copper, and/or an organic material, for example a polymer. The fact that the material is organic can mean, for example, that it includes carbon. The conduction elements may include or be formed by, for example, micro- or nanowires, for example silver nanowires, or nanotubes, for example carbon nanotubes, or electrically conductive, for example metallic, nanoparticles.

FIG. 4 shows a flow diagram of a method 400 for producing an optoelectronic component, for example the light-emitting component explained above.

The method 400 includes forming 410 an electrically conductive planarization layer on the surface of a metal substrate. The planarization layer includes a surface and includes scattering centers embedded in a matrix. The roughness of the surface of the planarization layer is lower than the roughness of the surface of the metal substrate. The surface of the metal substrate and/or the planarization layer are/is formed in a light-scattering fashion. The method furthermore includes forming 420 an organically functional layer structure on or above the surface of the planarization layer. The method additionally includes forming 430 a transparent electrode layer on or above the organically functional layer structure.

In one development, the planarization layer is formed with scattering centers embedded in a matrix. This enables a light scattering in the planarization layer and thus, in a simple manner, a setting of the light scattering in relation to a predefined light scattering.

In one development, the planarization layer is formed by means of a paste, wherein the paste includes the material of the matrix and the scattering centers. This enables a simple and cost-effective production of the planarization layer.

In one development, the planarization layer is formed by arranging a material in a particulate fashion on or above the metal substrate, wherein the particles include the material of the matrix.

In one development, the particles furthermore include the scattering centers.

In a further development, the planarization layer is furthermore formed with cavities arranged between the particles of the material of the matrix and the scattering centers.

In one development, the metal substrate includes a second electrode layer and a metal carrier. The second electrode layer is arranged on the metal carrier. The surface of the second electrode layer is the surface of the metal substrate.

In a further development, the optoelectronic component is formed as a light-emitting component.

In various developments, the method for producing the optoelectronic component includes the same features as the optoelectronic component, and vice versa.

The invention is not restricted to the embodiments indicated. By way of example, the light-emitting component may include a plurality or a multiplicity of light-emitting components and/or light-scattering layers.

LIST OF REFERENCE SIGNS

100 Optoelectronic component
102 Metal substrate
104 Metal carrier
106 First electrode layer
108 Planarization layer
110 Organically functional layer structure
112 Second electrode layer
16 First contact section
18 Second contact section
21 Electrical insulation barrier
24 Encapsulation layer
32 First contact region
34 Second contact region
36 Adhesion medium layer
38 Covering body
302 Matrix
304 Scattering centers
400, 410, 420, 430 Method steps
500 Optoelectronic component
502 Metal carrier
504 Planarization medium
506 Anode
508 Organically functional layer structure
510 Cathode
512 Thin-film encapsulation
514 Scattering layer
516 Scattering centers
518 Matrix While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An optoelectronic component, comprising:
   a metal substrate having a surface;
   an electrically conductive planarization layer on the surface of the metal substrate, wherein the planarization layer comprises a surface;
   an organically functional layer structure on or above the surface of the planarization layer; and
   an electrode layer formed in a transparent fashion on or above the organically functional layer structure;
   wherein the roughness of the surface of the planarization layer is lower than the roughness of the surface of the metal substrate; and
   wherein the surface of at least one of the metal substrate or the planarization layer is formed in a light-scattering fashion, and
   wherein the planarization layer comprises scattering centers embedded in a matrix.

2. The optoelectronic component of claim 1,
wherein the metal substrate comprises a second electrode layer and a metal carrier;
wherein the second electrode layer is arranged on the metal carrier; and
wherein the surface of the second electrode layer forms the surface of the metal substrate.

3. The optoelectronic component of claim 2,
wherein the metal carrier is a steel plate or a steel foil.

4. The optoelectronic component of claim 2,
wherein the planarization layer has a thickness that is greater than 2 times the roughness of the surface of the metal substrate.

5. The optoelectronic component of claim 1,
wherein the scattering centers are formed in an electrically conductive fashion.

6. The optoelectronic component of claim 1,
wherein the optoelectronic component is a light-emitting component.

7. A method for producing an optoelectronic component, the method comprising:
forming an electrically conductive planarization layer on the surface of a metal substrate;
  wherein the planarization layer comprises a surface, and
  wherein the roughness of the surface of the planarization layer is lower than the roughness of the surface of the metal substrate, and
  wherein the surface of at least one of the metal substrate or the planarization layer is formed in a light-scattering fashion;
forming an organically functional layer structure on or above the surface of the planarization layer; and
forming a transparent electrode layer on or above the organically functional layer structure, and
wherein the planarization layer comprises scattering centers embedded in a matrix.

8. The method of claim 7,
wherein the planarization layer is formed by means of a paste, wherein the paste comprises the material of the matrix and the scattering centers.

9. The method of claim 8,
wherein the planarization layer is formed by arranging a material in a particulate fashion on or above the metal substrate, wherein the particles comprise the material of the matrix.

10. The method of claim 9,
wherein the particles furthermore comprise the scattering centers.

11. The method of claim 10,
wherein the planarization layer is furthermore formed with cavities arranged between the particles of the material of the matrix and the scattering centers.

12. The method of claim 7,
wherein the metal substrate comprises a second electrode layer and a metal carrier, wherein the second electrode layer is arranged on the metal carrier, and
the surface of the second electrode layer forms the surface of the metal substrate.

13. The method of claim 7,
wherein the optoelectronic component is formed as a light-emitting component.

* * * * *